(12) United States Patent
Kuo et al.

(10) Patent No.: US 8,958,024 B2
(45) Date of Patent: Feb. 17, 2015

(54) BACK PLATE, BACKLIGHT MODULE AND LIQUID CRYSTAL DISPLAY DEVICE

(75) Inventors: Yi-cheng Kuo, Guandong (CN);
Yu-chun Hsiao, Guandong (CN);
Chengwen Que, Guandong (CN);
Pangling Zhang, Guandong (CN);
Dehua Li, Guandong (CN)

(73) Assignee: Shenzhen China Star Optoelectronics Technology Co., Lt, Shenzhen, Guangdong (CN)

( * ) Notice: Subject to any disclaimer, the term of this patent is extended or adjusted under 35 U.S.C. 154(b) by 252 days.

(21) Appl. No.: 13/578,617

(22) PCT Filed: Jul. 19, 2012

(86) PCT No.: PCT/CN2012/078871
§ 371 (c)(1),
(2), (4) Date: Aug. 11, 2012

(87) PCT Pub. No.: WO2014/012232
PCT Pub. Date: Jan. 23, 2014

(65) Prior Publication Data
US 2014/0022484 A1    Jan. 23, 2014

(30) Foreign Application Priority Data
Jul. 17, 2012 (CN) .......................... 2012 1 0247215

(51) Int. Cl.
*G02F 1/1333* (2006.01)
*G09F 13/18* (2006.01)
*H05K 7/18* (2006.01)
*H05K 7/20* (2006.01)

(52) U.S. Cl.
CPC .......... *G02F 1/133308* (2013.01); *G09F 13/18* (2013.01); *H05K 7/18* (2013.01); *H05K 7/20963* (2013.01)

USPC .......................................................... 349/58

(58) Field of Classification Search
USPC .......................................................... 349/58
See application file for complete search history.

(56) References Cited

U.S. PATENT DOCUMENTS

| | | | |
|---|---|---|---|
| 7,414,594 B2 * | 8/2008 | Kim et al. | 345/1.3 |
| 7,777,827 B2 * | 8/2010 | Park | 349/58 |
| 2010/0177020 A1 * | 7/2010 | Bemelmans et al. | 345/55 |
| 2010/0328556 A1 * | 12/2010 | Yamamoto | 348/790 |
| 2012/0205508 A1 * | 8/2012 | Cusson et al. | 248/231.81 |
| 2013/0069878 A1 * | 3/2013 | Li | 345/168 |
| 2014/0022485 A1 * | 1/2014 | Kuo et al. | 349/58 |
| 2014/0028946 A1 * | 1/2014 | Kuo et al. | 349/58 |
| 2014/0036196 A1 * | 2/2014 | Hsiao et al. | 349/58 |
| 2014/0043557 A1 * | 2/2014 | Kuo et al. | 349/58 |
| 2014/0043792 A1 * | 2/2014 | Kuo et al. | 362/97.1 |

* cited by examiner

*Primary Examiner* — Timothy L Rude
(74) *Attorney, Agent, or Firm* — Andrew C. Cheng

(57) ABSTRACT

The present invention provides a back plate, backlight module and liquid crystal display device. The back plate is formed by splicing a plurality of splicing elements, wherein at least some of splicing elements are connected through rotation mechanism so that the back plate can switch between normal usage state and folded state, the back plate in folded state is smaller than in normal usage state, at least one of the splicing elements is an aluminum extrusion. Through using aluminum extrusion as a part of splice-type back plate and heat-dissipating device, the present invention improves heat-dissipation capability of backlight module and increases the life span of backlight module. In addition, because the splicing elements of back plate are connected in a rotatable manner, the back plate can be folded so as to improve the efficiency of storage and transport and reduce storage and transport cost.

20 Claims, 5 Drawing Sheets

BACK PLATE, BACKLIGHT MODULE AND LIQUID CRYSTAL DISPLAY DEVICE

BACKGROUND OF THE INVENTION

1. Field of the Invention

The present invention relates to the field of liquid crystal displaying techniques, and in particular to a back plate, backlight module and liquid crystal display device.

2. The Related Arts

The back plate of liquid crystal display device can be either monolithically formed or by splicing parts. A splice-type back plate is a back plate formed by splicing a plurality of metal frames. In known technique, the LED light sources on the light bar usually dissipate a large amount of heat. As the metal of the splice-type back plate near the light bar has poor heat-dissipation capability, the LED light sources will operate inefficiently with reduced life span. Also, because the back plate has a large structure, the transport cost is usually high.

In summary, it is desired to have a back plate, backlight module and liquid crystal display device that overcomes the above problems.

SUMMARY OF THE INVENTION

The technical issue to be addressed by the present invention is to provide a back plate, backlight module and liquid crystal display device to overcome the problems of poor heat-dissipation capability and high transport cost of the known backlight module.

The present invention provides a back plate, formed by splicing a plurality of splicing elements, wherein at least some of the splicing elements are connected through rotation mechanism so that the back plate can be switched between normal usage state and folded state, and the back plate in the folded state is smaller in size than in the normal usage state, at least one of the splicing elements is an aluminum extrusion.

According to a preferred embodiment of the present invention, in the normal usage state, the plurality of splicing elements comprises: a first support frame and a second support frame disposed in parallel; a third support frame connected perpendicularly respectively to one end of each of the first support frame and the second support frame; and an aluminum extrusion, connected perpendicularly respectively to the other end of each of the first support frame and the second support frame.

According to a preferred embodiment of the present invention, a plurality of auxiliary support frames are disposed between the first support frame and the second support frame, with both ends of each of the auxiliary support frames connected respectively to the first support frame and the second support frame.

According to a preferred embodiment of the present invention, the first support frame comprises a first main part and a first extension part extending from one end of the first main part; the second support frame comprises a second main part and a second extension part extending from one end of the second main part; the first extension part and one end of the third support frame, the other end of the third support frame and one end of the second main part away from the second extension part, the second extension part and one end of the aluminum extrusion, the other end of the aluminum extrusion and one end of the first main part away from the first extension part are all connected respectively through the rotation mechanism.

According to a preferred embodiment of the present invention, in the folded state, the first main part is connected levelly to the aluminum extrusion and is located between the first extension part and the second extension part; the second main part is connected levelly to the third support frame and is located between the first extension part and the second extension part.

According to a preferred embodiment of the present invention, the total length of first main part levelly connected to aluminum extrusion is equal to the total length of second main part levelly connected to the third support frame.

According to a preferred embodiment of the present invention, the back plate comprises two first main splicing elements disposed in parallel in normal usage state, two second main splicing elements disposed in parallel in normal usage state and at least two auxiliary splicing elements disposed crossly, wherein at least one of the two second main splicing elements is an aluminum extrusion, the at least two auxiliary splicing elements are connected through rotation mechanism, one end of the first main splicing element and one end of the second main splicing element are connected to one end of the corresponding auxiliary splicing element through rotation mechanism.

According to a preferred embodiment of the present invention, the number of auxiliary splicing elements is four, the back plate further comprises a first auxiliary mechanism, the other end of each of the four auxiliary splicing elements is connected to the first auxiliary mechanism through the rotation mechanism; the back plate further comprises four second auxiliary mechanism, one end of the first main splicing element, one end of the second main splicing element and one end of auxiliary splicing element are connected respectively to corresponding second auxiliary mechanism through rotation mechanism.

The present invention provides a backlight module, which comprises: a back plate, formed by splicing a plurality of splicing elements, wherein at least some of the splicing elements are connected through rotation mechanism so that the back plate can be switched between normal usage state and folded state, and the back plate in the folded state is smaller in size than in the normal usage state, at least one of the splicing elements is an aluminum extrusion; light-guiding plate, disposed on the back plate; and light bar, disposed on side wall of the aluminum extrusion facing light-guiding plate.

According to a preferred embodiment of the present invention, in the normal usage state, the plurality of splicing elements comprises: a first support frame and a second support frame disposed in parallel; a third support frame connected perpendicularly respectively to one end of each of the first support frame and the second support frame; and an aluminum extrusion, connected perpendicularly respectively to the other end of each of the first support frame and the second support frame.

According to a preferred embodiment of the present invention, a plurality of auxiliary support frames are disposed between the first support frame and the second support frame, with both ends of each of the auxiliary support frames connected respectively to the first support frame and the second support frame.

According to a preferred embodiment of the present invention, the first support frame comprises a first main part and a first extension part extending from one end of the first main part; the second support frame comprises a second main part and a second extension part extending from one end of the second main part; the first extension part and one end of the third support frame, the other end of the third support frame and one end of the second main part away from the second extension part, the second extension part and one end of the aluminum extrusion, the other end of the aluminum extrusion and one end of the first main part away from the first extension part are all connected respectively through the rotation mechanism.

According to a preferred embodiment of the present invention, in the folded state, the first main part is connected levelly to the aluminum extrusion and is located between the first extension part and the second extension part; the second main part is connected levelly to the third support frame and is located between the first extension part and the second extension part.

According to a preferred embodiment of the present invention, the total length of first main part levelly connected to aluminum extrusion is equal to the total length of second main part levelly connected to the third support frame.

According to a preferred embodiment of the present invention, the back plate comprises two first main splicing elements disposed in parallel in normal usage state, two second main splicing elements disposed in parallel in normal usage state and at least two auxiliary splicing elements disposed crossly, wherein at least one of the two second main splicing elements is an aluminum extrusion, the at least two auxiliary splicing elements are connected through rotation mechanism, one end of the first main splicing element and one end of the second main splicing element are connected to one end of the corresponding auxiliary splicing element through rotation mechanism.

According to a preferred embodiment of the present invention, the number of auxiliary splicing elements is four, the back plate further comprises a first auxiliary mechanism, the other end of each of the four auxiliary splicing elements is connected to the first auxiliary mechanism through the rotation mechanism; the back plate further comprises four second auxiliary mechanism, one end of the first main splicing element, one end of the second main splicing element and one end of auxiliary splicing element are connected respectively to corresponding second auxiliary mechanism through rotation mechanism.

The present invention provides a liquid crystal display device, which comprises: a backlight module, comprising: a back plate, formed by splicing a plurality of splicing elements, wherein at least some of the splicing elements are connected through rotation mechanism so that the back plate can be switched between normal usage state and folded state, and the back plate in the folded state is smaller in size than in the normal usage state, at least one of the splicing elements is an aluminum extrusion; light-guiding plate, disposed on the back plate; and light bar, disposed on side wall of the aluminum extrusion facing light-guiding plate; a liquid crystal panel, disposed on the backlight module; and a front frame, assembled with the back plate so as to firmly sandwich the liquid crystal panel between the front frame and the backlight module.

According to a preferred embodiment of the present invention, the first support frame comprises a first main part and a first extension part extending from one end of the first main part; the second support frame comprises a second main part and a second extension part extending from one end of the second main part; the first extension part and one end of the third support frame, the other end of the third support frame and one end of the second main part away from the second extension part, the second extension part and one end of the aluminum extrusion, the other end of the aluminum extrusion and one end of the first main part away from the first extension part are all connected respectively through the rotation mechanism.

According to a preferred embodiment of the present invention, in the folded state, the first main part is connected levelly to the aluminum extrusion and is located between the first extension part and the second extension part; the second main part is connected levelly to the third support frame and is located between the first extension part and the second extension part.

According to a preferred embodiment of the present invention, the total length of first main part levelly connected to aluminum extrusion is equal to the total length of second main part levelly connected to the third support frame.

The efficacy of the present invention is that to be distinguished from the state of the art. Through using aluminum extrusion as a part of splice-type back plate and heat-dissipating device, the present invention improves heat-dissipation capability of the backlight module and increases the life span of the backlight module. In addition, because the splicing elements of the back plate are connected in a rotatable manner, the back plate can switch between a normal usage state and a folded state. The size of the back plate in folded state is smaller than in normal usage state so as to improve the efficiency of storage and transport and reduce the storage and the transport cost.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

The following description refers to drawings and embodiments of the present invention.

Figure 1:
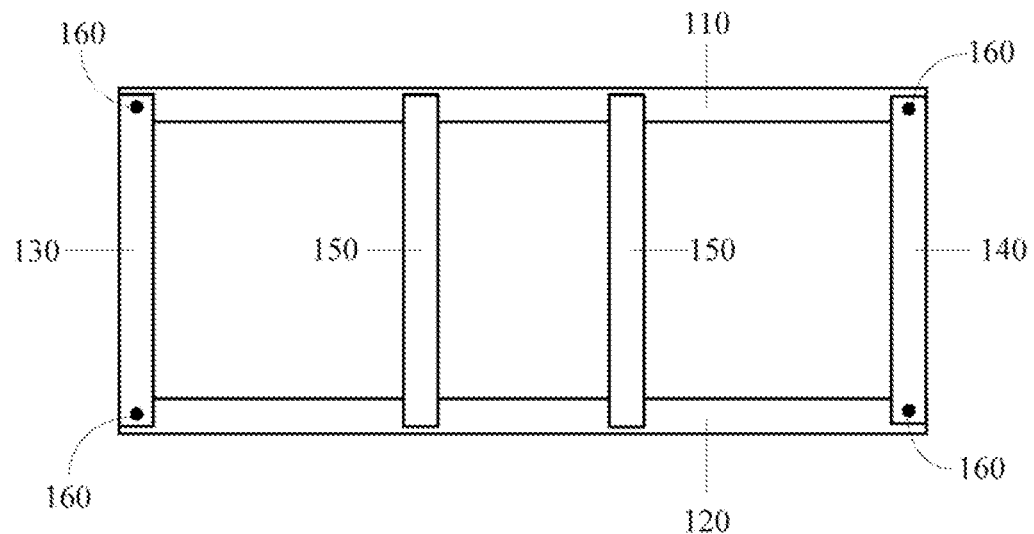
FIG. 1 is a top view showing the structure of the first embodiment of the back plate in normal usage state according to the present invention.

Referring to FIG. 1, FIG. 1 is a top view showing the structure of the first embodiment of the back plate in normal usage state according to the present invention. In the instant embodiment, back plate comprises first support frame 110, second support frame 120, third support frame 130, aluminum extrusion 140 and auxiliary support frame 150.

In the instant embodiment, first support frame 110, second support frame 120, third support frame 130 and aluminum extrusion 140 are all of a long stripe structure, and are spliced to form an outer frame of the back plate. The outer frame of the back plate in a normal usage state is a rectangular structure. Specifically, first support frame 110 and second support frame 120 are disposed in parallel, and third support frame 130 and aluminum extrusion 140 are disposed in parallel. Third support frame 130 is connected perpendicularly respectively to one end of each of first support frame 110 and second support frame 120. Aluminum extrusion 140 is connected perpendicularly respectively to the other end of each of first support frame 110 and second support frame 120. Both ends of auxiliary support frame 150 are connected respectively to first support frame 110 and second support frame 120. Auxiliary support frame 150 is disposed in parallel with third support frame 130 and aluminum extrusion 140. The number of auxiliary support frames can be single or plural.

In the instant embodiment, preferably, one end of first support frame 110 and one end of third support frame 130, the other end of first support frame 110 and one end of aluminum extrusion 140, one end of second support frame 120 and the other end of third support frame 130, the other end of second support frame 120 and the other end of aluminum extrusion 140 are respectively connected through a rotation structure 160 so that adjacent first support frame 110, second support frame 120, third support frame 130 and aluminum extrusion 140 can all rotate around rotation structure 160 respectively. As such, the back plate can switch between the normal usage state and a folded state. Rotation structure 160 can be screw, rivet, bolt or any other equivalent fastening element.

Figure 2:
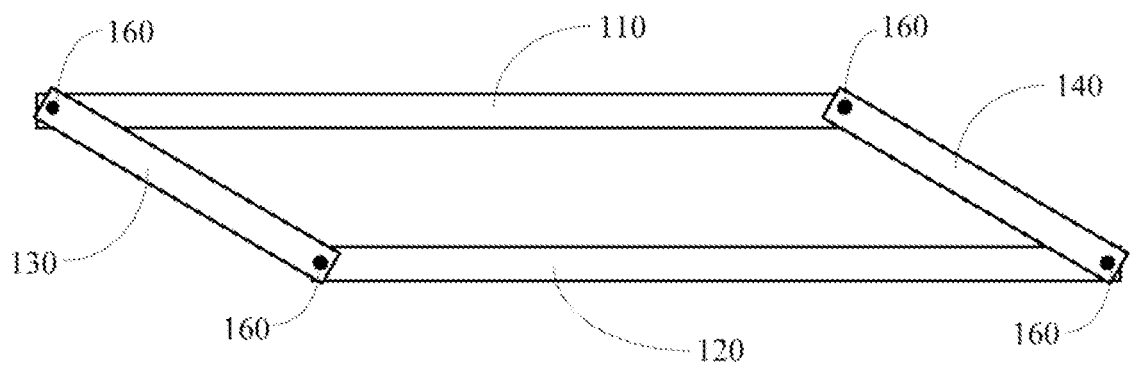
FIG. 2 is a top view showing the structure of the first embodiment of the back plate in folded state according to the present invention.

Referring to FIG. 2, FIG. 2 is a top view showing the structure of the first embodiment of the back plate in folded state according to the present invention. Compared to FIG. 1 when switching from normal usage state to folded state, auxiliary support frame 150 of the back plate is removed so that first support frame 110 and second support frame 120, and third support frame 130 and aluminum extrusion 140 can rotate around rotation structure 160 respectively. As such, the outer frame of the back plate changes from a rectangle to a parallelogram, so that the back plate in folded state occupies a smaller space than in normal usage state.

Figure 3:
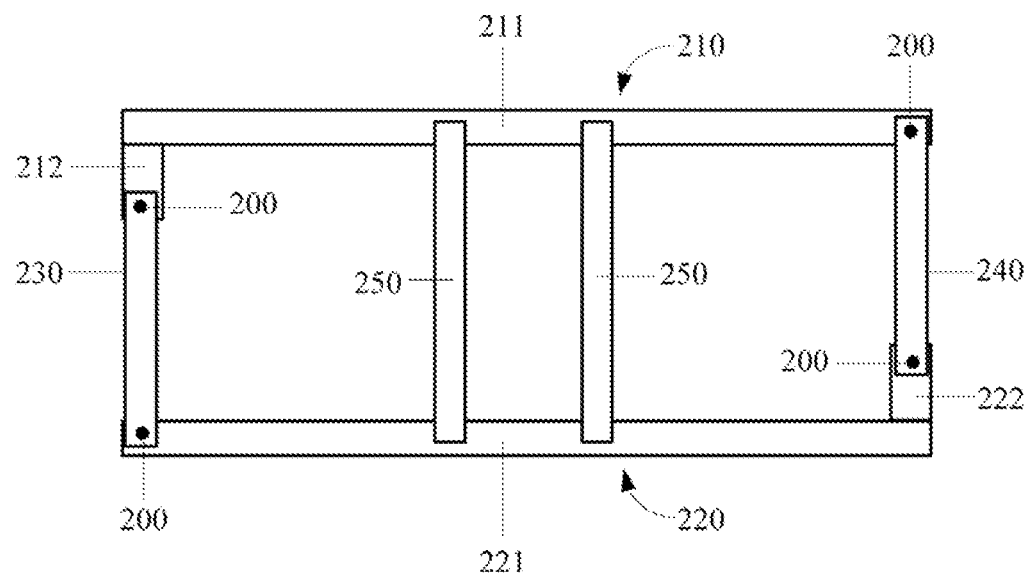
FIG. 3 is a top view showing the structure of the second embodiment of the back plate in normal usage state according to the present invention.

Referring to FIG. 3, FIG. 3 is a top view showing the structure of the second embodiment of the back plate in normal usage state according to the present invention. In the instant embodiment, the back plate comprises first support frame 210, second support frame 220, third support frame 230, aluminum extrusion 240 and auxiliary support frame 250.

In normal usage state, first support frame 210 and second support frame 220 are disposed in parallel, and third support frame 230 and aluminum extrusion 240 are disposed in parallel. First support frame 210, second support frame 220, third support frame 230 and aluminum extrusion 240 are spliced to form the outer frame of the back plate. Auxiliary support frame 250 is disposed in parallel with third support frame 230 and aluminum extrusion 240. The number of auxiliary support frames 250 can be single or plural.

The differences between this embodiment and the first embodiment are that first support frame 210 comprises a first main part 211 and a first extension part 212 extending from one end of first main part 211, and second support frame 220 comprises a second main part 221 and a second extension part 222 extending from one end of second main part 221.

In the instant embodiment, first extension part 212 and one end of third support frame 230, the other end of third support frame 230 and one end of second main part 221 away from second extension part 222, second extension part 222 and one end of aluminum extrusion 240, the other end of aluminum extrusion 240 and one end of first main part 211 away from first extension part 212 are all connected respectively through a rotation mechanism 200.

Figure 4:
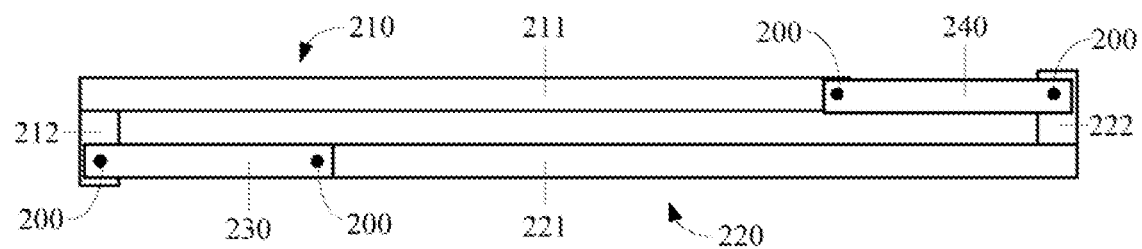
FIG. 4 is a top view showing the structure of the second embodiment of the back plate in folded state according to the present invention.

In comparison with FIG. 3, FIG. 4 is a top view showing the structure of the second embodiment of the back plate in folded state according to the present invention. When switching from normal usage state to folded state, auxiliary support frame 250 of the back plate is removed so that first support frame 210 and second support frame 220, and third support frame 230 and aluminum extrusion 240 can rotate around rotation mechanism 200 respectively. As such, the outer frame of the back plate changes from a rectangle to a parallelogram. When the back plate is in the folded state, first main part 211 is connected levelly to aluminum extrusion 240 and is located between first extension part 212 and second extension part 222. Similarly, second main part 221 is connected levelly to third support frame 230 and is located between first extension part 212 and second extension part 222. In addition, the total length of first main part 211 levelly connected to aluminum extrusion 240 is equal to the total length of second main part 221 levelly connected to third support frame 230.

As such, the back plate of the instant embodiment can also switch between the normal usage state shown in FIG. 3 and the folded state shown in FIG. 4, and the back plate in folded state occupies a smaller space than in normal usage state.

In the instant embodiment, aluminum extrusion 240 is near the light bars of the backlight module. As such, aluminum extrusion 240 can be a part of back plate to support the outer frame of the back plate as well as a heat-dissipation element for the backlight module for dissipating heat from the light bar.

Figure 5:
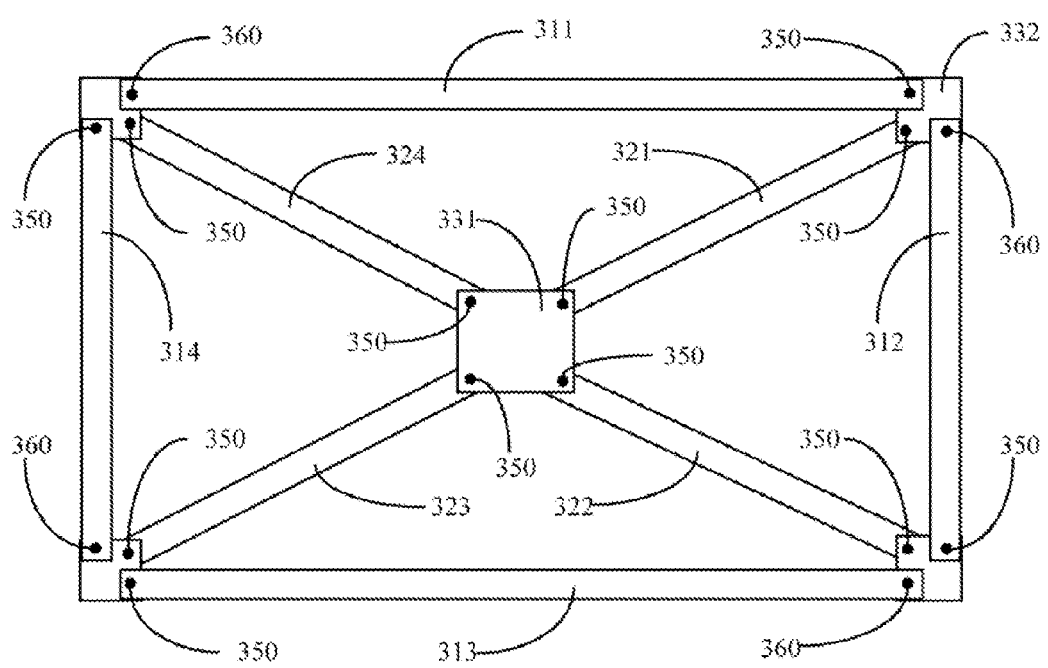
FIG. 5 is a top view showing the structure of the third embodiment of the back plate in normal usage state according to the present invention.

Referring to FIG. 5, FIG. 5 is a top view showing the structure of the third embodiment of the back plate in normal usage state according to the present invention. In the instant embodiment, the back plate comprises two first main splicing elements 311, 313, two second main splicing elements 312, 314, four auxiliary splicing elements 321, 322, 323, 324, a first auxiliary mechanism 331, four second auxiliary mechanisms 332 and a plurality of rotation mechanisms 350.

In normal usage state, first main splicing elements 311, 313 are disposed in parallel in normal usage state, and second main splicing elements 312, 314 are disposed in parallel to form outer frame of the back plate. In the instant embodiment, one end of each of first main splicing elements 311, 313 and second main splicing elements 312, 314 is connected to corresponding second auxiliary mechanism 332 through rotation mechanism 350 respectively, and the other end is preferably is connected to corresponding second auxiliary mechanism 332 through stop mechanism 360. Auxiliary splicing elements 321, 322, 323, 324 are disposed in a cross manner, with one end connected to corresponding second auxiliary mechanism 332 through rotation mechanism 350 and the other end connected to first auxiliary mechanism 331 through rotation mechanism 350.

In the instant embodiment, stop mechanism 360 is for providing better fastening to the outer frame of the back plate. In other embodiments, for saving cost and reducing complexity, stop mechanism 360 can be disposed at only one or more connections for fastening. In the present embodiment, stop mechanism 360 can be screw, rivet, bolt or other equivalent fastening element.

In the instant embodiment, at least one of second main splicing elements 312, 314 is an aluminum extrusion. The aluminum extrusion is neat the light bar of backlight module for heat-dissipation.

Figure 6:
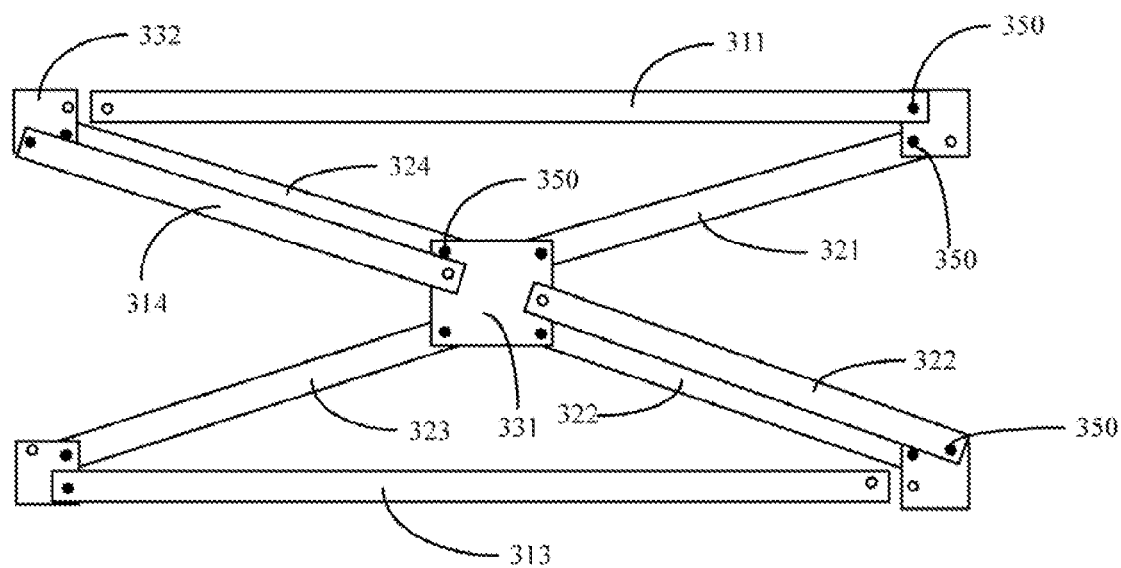
FIG. 6 is a top view showing the structure of the third embodiment of the back plate in folded state according to the present invention.

Referring to FIG. 6, FIG. 6 is a top view showing the structure of the third embodiment of the back plate in folded state according to the present invention. When switching from normal usage state to folded state, stop mechanisms 360 of the back plate are removed so that each auxiliary splicing element 321, 322, 323, 324 can rotate around first auxiliary mechanism 331 to reduce width of the back plate to save space. In the mean time, first main splicing elements 311, 313 and second main splicing elements 312, 314 use rotation mechanism 350 as axis to make fastened end of stop mechanism 360 rotate towards first auxiliary mechanism 331. As different from the first and the second embodiments of the present invention, the present embodiment uses first auxiliary mechanism 331 as a center to rotate auxiliary splicing elements 321, 322, 323, 324 to realize the switching between the normal usage state shown in FIG. 5 and the folded state shown in FIG. 6 so that the back plate in folded state occupies a smaller space than in normal usage state.

In other embodiments, the third embodiment can be simplified, for example, by cancelling second auxiliary mechanism 332. One end of first main splicing elements 311, 313 and one end of second main splicing elements 312, 314 are connected respectively to one end of corresponding auxiliary splicing elements 321, 322, 323, 324 through rotation mechanism 350. Alternatively, auxiliary splicing elements 321, 323 are replaced by an auxiliary splicing element, auxiliary splicing elements 322, 324 are replaced by another auxiliary splicing element and rotation mechanism 350 is placed between the two for connection.

In other embodiments, those having ordinary skills in the art may easily vary the structures and elements of these drawings without paying any creative effort as long as some of the splicing elements are able to rotate through rotation mechanism so that the back plate can switch between a normal usage state and a folded state to achieve the object of the present invention, and not limited to embodiments shown in FIGS. 1-6.

Figure 7:
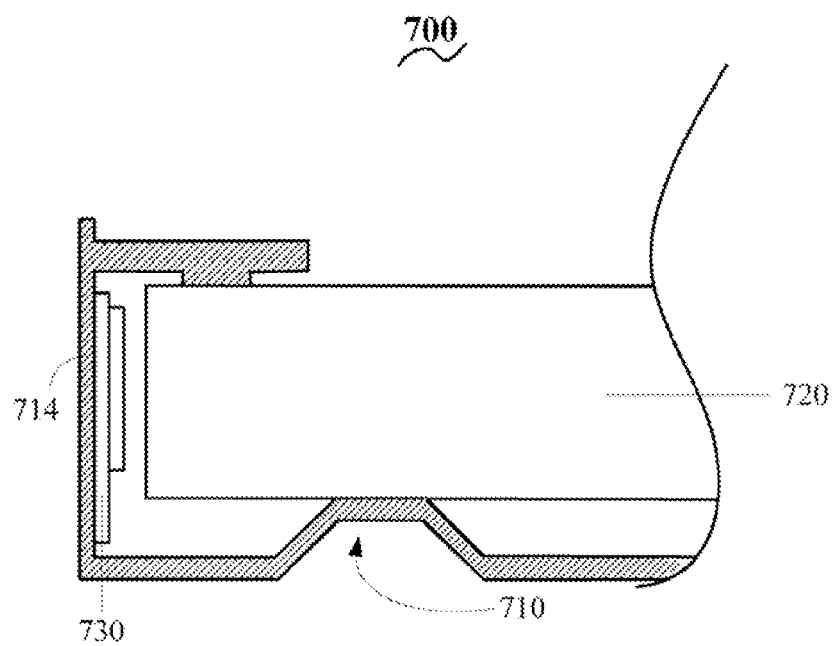
FIG. 7 is a schematic view showing the structure of an embodiment of the backlight module according to the present invention.

FIG. 7 is a schematic view showing the structure of an embodiment of the backlight module according to the present invention. As shown in FIG. 7, backlight module 700 comprises back plate 710, light-guiding plate 720 and light bar 730.

In the embodiment, light-guiding plate 720 is disposed on back plate 710 and back plate 710 disposed to the light-entering side is aluminum extrusion 714. Light bar 730 is disposed on side wall of aluminum extrusion 714 of back plate 710 facing light-guiding plate 720.

In the instant embodiment, aluminum extrusion 714 is not only a part of back plate 710, but also a heat-dissipation element for backlight module 700 to improve the heat-dissipating capability of light bar 730 located on the light-entering side of the light-guiding plate 720 and reduce the operating temperature of light bar 730 so as to improve life span of backlight module 700.

Figure 8:
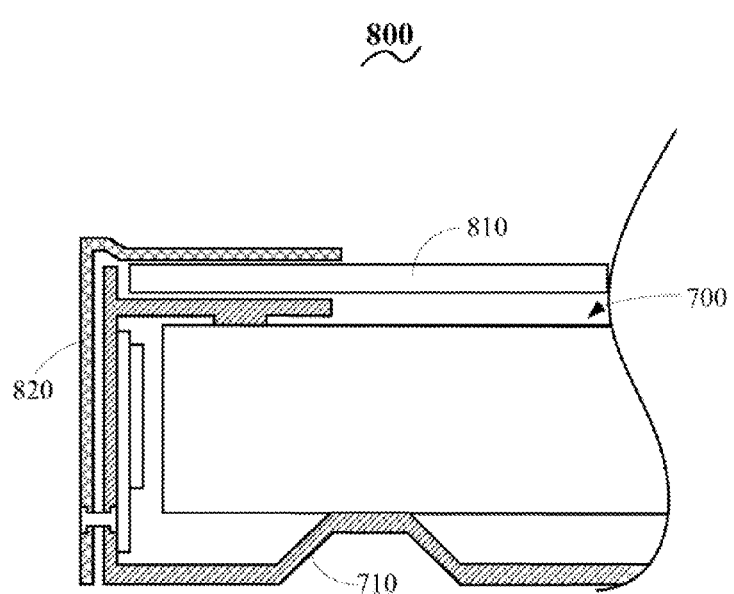
FIG. 8 is a schematic view showing the structure of an embodiment of the liquid crystal display device according to the present invention.

FIG. 8 is a schematic view showing the structure of an embodiment of the liquid crystal display device according to the present invention. As shown in FIG. 8, liquid crystal display device 800 comprises, backlight module 700, liquid crystal panel 810 and front frame 820.

In the instant embodiment, liquid crystal panel 810 is disposed on backlight module 700, front frame 820 is assembled with back plate 710 so as to firmly sandwich liquid crystal panel 810 between front frame 820 and backlight module 700.

In the present embodiment, the aforementioned aluminum extrusion is used to form a part of and a heat-dissipation element of the backlight module 700 to improve the life span liquid crystal display device 800.

In summary, through using aluminum extrusion as a part of splice-type back plate and heat-dissipating device, the present invention improves heat-dissipation capability of the backlight module and increases the life span of the backlight module. In addition, because the splicing elements of the back plate are connected in a rotatable manner, the back plate can switch between a normal usage state and a folded state. The size of the back plate in folded state is smaller than in normal usage state so as to improve the efficiency of storage and transport and reduce the storage and the transport cost.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A back plate, characterized in that the back plate being formed by splicing a plurality of splicing elements, wherein at least some of the splicing elements are connected through rotation mechanism so that the back plate able to be switched between a normal usage state and a folded state, and the back plate in the folded state being smaller in size than in the normal usage state, at least one of the splicing elements being an aluminum extrusion.

2. The back plate as claimed in claim 1, characterized in that, in the normal usage state, the plurality of splicing elements comprises:
   a first support frame and a second support frame disposed in parallel;
   a third support frame connected perpendicularly respectively to one end of each of the first support frame and the second support frame; and
   an aluminum extrusion, connected perpendicularly respectively to the other end of each of the first support frame and the second support frame.

3. The back plate as claimed in claim 2, characterized in that a plurality of auxiliary support frames are disposed between the first support frame and the second support frame, with both ends of each of the auxiliary support frames connected respectively to the first support frame and the second support frame.

4. The back plate as claimed in claim 2, characterized in that the first support frame comprises a first main part and a first extension part extending from one end of the first main part; the second support frame comprises a second main part and a second extension part extending from one end of the second main part; the first extension part and one end of the third support frame, the other end of the third support frame and one end of the second main part away from the second extension part, the second extension part and one end of the aluminum extrusion, the other end of the aluminum extrusion and one end of the first main part away from the first extension part are all connected respectively through the rotation mechanism.

5. The back plate as claimed in claim 4, characterized in that in the folded state, the first main part is connected levelly to the aluminum extrusion and is located between the first extension part and the second extension part; the second main part is connected levelly to the third support frame and is located between the first extension part and the second extension part.

6. The back plate as claimed in claim 5, characterized in that total length of first main part levelly connected to aluminum extrusion is equal to total length of second main part levelly connected to the third support frame.

7. The back plate as claimed in claim 1, characterized in that the back plate comprises two first main splicing elements disposed in parallel in normal usage state, two second main splicing elements disposed in parallel in normal usage state and at least two auxiliary splicing elements disposed crossly, wherein at least one of the two second main splicing elements is an aluminum extrusion, the at least two auxiliary splicing elements are connected through rotation mechanism, one end of the first main splicing element and one end of the second main splicing element are connected to one end of the corresponding auxiliary splicing element through rotation mechanism.

8. The back plate as claimed in claim 7, characterized in that the number of auxiliary splicing elements is four, the back plate further comprises a first auxiliary mechanism, the other end of each of the four auxiliary splicing elements is connected to the first auxiliary mechanism through the rotation mechanism; the back plate further comprises four second auxiliary mechanism, one end of the first main splicing element, one end of the second main splicing element and one end of auxiliary splicing element are connected respectively to corresponding second auxiliary mechanism through rotation mechanism.

9. A backlight module, which comprises:
a back plate, formed by splicing a plurality of splicing elements, wherein at least some of the splicing elements are connected through rotation mechanism so that the back plate can be switched between normal usage state and folded state, and the back plate in the folded state is smaller in size than in the normal usage state, at least one of the splicing elements is an aluminum extrusion;
light-guiding plate, disposed on the back plate; and
light bar, disposed on side wall of the aluminum extrusion facing light-guiding plate.

10. The backlight module as claimed in claim 9, characterized in that, in the normal usage state, the plurality of splicing elements comprises:
a first support frame and a second support frame disposed in parallel;
a third support frame connected perpendicularly respectively to one end of each of the first support frame and the second support frame; and
an aluminum extrusion, connected perpendicularly respectively to the other end of each of the first support frame and the second support frame.

11. The backlight module as claimed in claim 10, characterized in that a plurality of auxiliary support frames are disposed between the first support frame and the second support frame, with both ends of each of the auxiliary support frames connected respectively to the first support frame and the second support frame.

12. The backlight module as claimed in claim 10, characterized in that the first support frame comprises a first main part and a first extension part extending from one end of the first main part; the second support frame comprises a second main part and a second extension part extending from one end of the second main part; the first extension part and one end of the third support frame, the other end of the third support frame and one end of the second main part away from the second extension part, the second extension part and one end of the aluminum extrusion, the other end of the aluminum extrusion and one end of the first main part away from the first extension part are all connected respectively through the rotation mechanism.

13. The backlight module as claimed in claim 12, characterized in that in the folded state, the first main part is connected levelly to the aluminum extrusion and is located between the first extension part and the second extension part; the second main part is connected levelly to the third support frame and is located between the first extension part and the second extension part.

14. The back plate as claimed in claim 13, characterized in that total length of first main part levelly connected to aluminum extrusion is equal to total length of second main part levelly connected to the third support frame.

15. The backlight module as claimed in claim 9, characterized in that the back plate comprises two first main splicing elements disposed in parallel in normal usage state, two second main splicing elements disposed in parallel in normal usage state and at least two auxiliary splicing elements disposed crossly, wherein at least one of the two second main splicing elements is an aluminum extrusion, the at least two auxiliary splicing elements are connected through rotation mechanism, one end of the first main splicing element and one end of the second main splicing element are connected to one end of the corresponding auxiliary splicing element through rotation mechanism.

16. The backlight module as claimed in claim 15, characterized in that the number of auxiliary splicing elements is four, the back plate further comprises a first auxiliary mechanism, the other end of each of the four auxiliary splicing elements is connected to the first auxiliary mechanism through the rotation mechanism; the back plate further comprises four second auxiliary mechanism, one end of the first main splicing element, one end of the second main splicing element and one end of auxiliary splicing element are connected respectively to corresponding second auxiliary mechanism through rotation mechanism.

17. A liquid crystal display device, which comprises:
a backlight module, comprising: a back plate, formed by splicing a plurality of splicing elements, wherein at least some of the splicing elements are connected through rotation mechanism so that the back plate can be switched between normal usage state and folded state, and the back plate in the folded state is smaller in size than in the normal usage state, at least one of the splicing elements is an aluminum extrusion; light-guiding plate, disposed on the back plate; and light bar, disposed on side wall of the aluminum extrusion facing light-guiding plate;
a liquid crystal panel, disposed on the backlight module; and
a front frame, assembled with the back plate so as to firmly sandwich the liquid crystal panel between the front frame and the backlight module.

18. The liquid crystal display device as claimed in claim 17, characterized in that the first support frame comprises a first main part and a first extension part extending from one end of the first main part; the second support frame comprises a second main part and a second extension part extending from one end of the second main part; the first extension part and one end of the third support frame, the other end of the third support frame and one end of the second main part away from the second extension part, the second extension part and one end of the aluminum extrusion, the other end of the aluminum extrusion and one end of the first main part away from the first extension part are all connected respectively through the rotation mechanism.

19. The liquid crystal display device as claimed in claim 18, characterized in that in the folded state, the first main part is connected levelly to the aluminum extrusion and is located between the first extension part and the second extension part; the second main part is connected levelly to the third support frame and is located between the first extension part and the second extension part.

20. The liquid crystal display device as claimed in claim 19, characterized in that total length of first main part levelly connected to aluminum extrusion is equal to total length of second main part levelly connected to the third support frame.

* * * * *